United States Patent
Jeong et al.

(10) Patent No.: US 7,589,999 B2
(45) Date of Patent: Sep. 15, 2009

(54) METHOD AND APPARATUS FOR PROGRAMMING NON-VOLATILE DATA STORAGE DEVICE

(75) Inventors: Seong-hun Jeong, Suwon-si (KR); Houng-sog Min, Ansan-si (KR); Dong-woo Lee, Suwon-si (KR); Shin-wook Kang, Hwaseong-si (KR); Hyang-suk Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/713,638

(22) Filed: Mar. 5, 2007

(65) Prior Publication Data

US 2008/0049513 A1 Feb. 28, 2008

(30) Foreign Application Priority Data

Aug. 22, 2006 (KR) .................. 10-2006-0079527

(51) Int. Cl.
*G11C 11/34* (2006.01)
(52) U.S. Cl. ..................... 365/185.08; 365/185.24
(58) Field of Classification Search ............ 365/185.08, 365/185.24
See application file for complete search history.

(56) References Cited

U.S. PATENT DOCUMENTS

| 6,885,583 B2 * | 4/2005 | Tanaka ................. 365/185.08 |
|---|---|---|
| 7,009,878 B2 * | 3/2006 | Hosono et al. ......... 365/185.03 |
| 2005/0157560 A1 * | 7/2005 | Hosono et al. ......... 365/185.22 |
| 2006/0227607 A1 * | 10/2006 | Park et al. .............. 365/185.12 |
| 2007/0061538 A1 * | 3/2007 | Chang et al. ................ 711/169 |
| 2007/0263446 A1 * | 11/2007 | Chen .................... 365/185.17 |
| 2008/0049520 A1 * | 2/2008 | Kang et al. ............ 365/185.33 |
| 2008/0080260 A1 * | 4/2008 | Seong ................... 365/189.05 |

FOREIGN PATENT DOCUMENTS

| JP | 2003-58419 A | 2/2003 |
|---|---|---|
| KR | 10-2000-0060710 A | 10/2000 |
| KR | 10-2005-0055215 A | 6/2005 |

\* cited by examiner

*Primary Examiner*—Michael T Tran
(74) *Attorney, Agent, or Firm*—Sughrue Mion, PLLC (57) ABSTRACT

A method and apparatus are provided for programming a non-volatile data storage device, in which a fast write operation can be performed using a plurality of page buffers included in the non-volatile data storage device when the write operation is performed in a way of using interleaving for each channel in a multi-channel system using a plurality of non-volatile data storage devices. The method includes programming data in a memory cell array included in the non-volatile data storage device using a page buffer selected from among a plurality of page buffers included in the non-volatile data storage device and performing a setup operation for loading data using another page buffer, which is different from the page buffer selected during the programming.

17 Claims, 7 Drawing Sheets

METHOD AND APPARATUS FOR PROGRAMMING NON-VOLATILE DATA STORAGE DEVICE

CROSS-REFERENCE TO RELATED PATENT APPLICATION

This application claims the benefit of Korean Patent Application No. 10-2006-0079527, filed on Aug. 22, 2006, in the Korean Intellectual Property Office, the disclosure of which is incorporated herein in its entirety by reference.

BACKGROUND OF THE INVENTION

1. Field of the Invention

Methods and apparatuses consistent with the present invention relate to a memory device, and more particularly, to programming a non-volatile data storage device, in which a fast write operation is enabled when a write operation is performed using interleaving for each channel in a multi-channel system using a plurality of non-volatile data storage devices.

2. Description of the Related Art

Multimedia devices including mobile devices store and provide large-size multimedia data such as MPEG-I Audio Layer 3 (MP3) audio and moving pictures. Since storage devices used in the multimedia devices provide a large storage space, a function of fast reading and writing data should also be provided.

Among non-volatile data storage devices, flash memory is used as a storage device for various mobile devices due to its low power consumption, small size, low generation of heat, and high stability. The size of a storage space in a memory also increases quickly.

Figure 1:
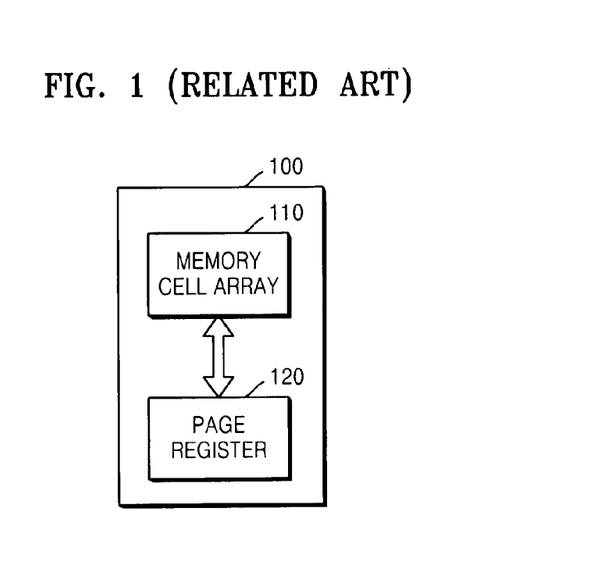
FIG. 1 is a block diagram illustrating the internal structure of a flash memory 100 according to the related art.

FIG. 1 is a block diagram illustrating the internal structure of a flash memory 100 according to the related art. Referring to FIG. 1, the flash memory 100 includes a memory cell array 110 and a page register (page buffer) 120.

The flash memory 100 is a non-volatile memory device in which data can be electrically erased/written repeatedly and is classified into a NOR type and a NAND type according to the connection state between cells and bit lines. The flash memory 100 includes the memory cell array 110 as a storage region for storing information. The memory cell array 110 consists of a plurality of blocks, each of which consists of a plurality of cell strings (also referred to as NAND strings). The page register (page buffer) 120 is provided in the flash memory 100 in order to store data in the memory cell array 110 or to read data from the memory cell array 110. As is well known to those of ordinary skill in the art, the memory cell array 110 of the flash memory 100 is erased or programmed using Fowler-Nordheim (F-N) tunneling current.

For a write operation with respect to the flash memory 100, a write command is given to the flash memory 100 by a controller in order to store data in the memory cell array 110 and an address and data are consecutively input to the flash memory 100. In general, data, which is assigned to be programmed, is sequentially transmitted to the page buffer 120 in units of a byte or word. After the data, which is assigned to be programmed, i.e., data corresponding to one page, is loaded in the page buffer 120. As a result, the data stored in the page buffer 120 is programmed in the memory cell array 110 according to a programming command. Before data is re-written to an already-recorded region, an erase command should be executed first for each block including a plurality of pages. In other words, after an erase operation is performed for each block, which is the basic unit of the erase operation, data is sequentially written in a plurality of pages forming a block. At this time, the written operation with respect to the flash memory 100 includes two steps, i.e., i) moving data that is to be recorded to the page buffer 120 and ii) programming data of the page buffer 120 to the memory cell array 110.

Figure 2:
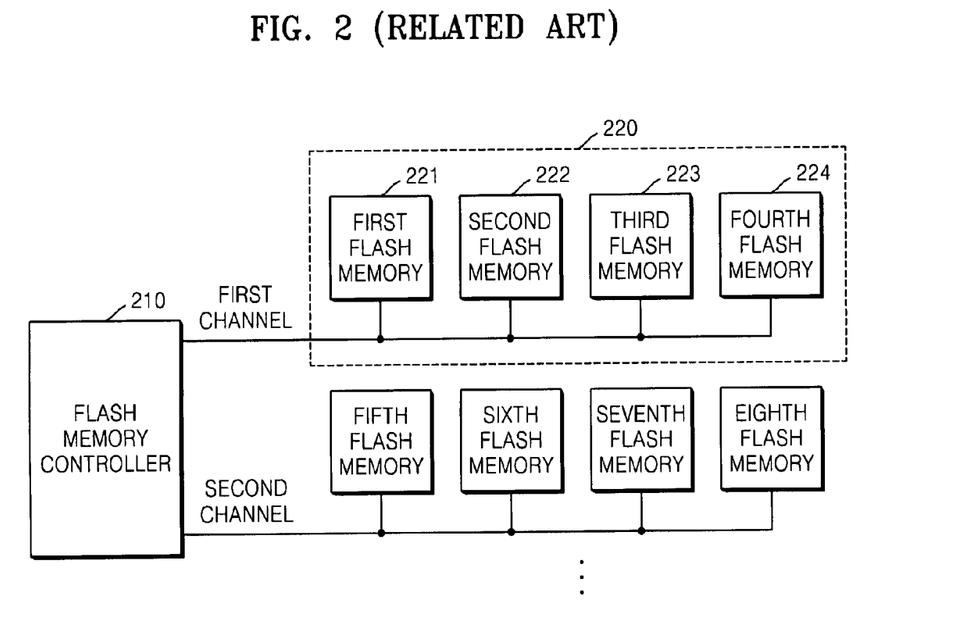
FIG. 2 illustrates a hardware architecture of an N-channel/four-way type using flash memories according to the related art.

FIG. 2 illustrates a hardware architecture of an N-channel/four-way type using flash memories according to the related art.

In general, a flash memory having a low programming speed and various architectures for preventing a controller from staying in a wait state during programming has been suggested. In FIG. 2, a flash memory controller 210 and four flash memories 221 through 224 for each channel are illustrated. In the case of a first channel 220, when the flash memory is programmed, the four flash memories 221 through 224 are connected by a system bus and interleaving is adopted so as to minimize the wait time of the controller 210.

Figure 3A:
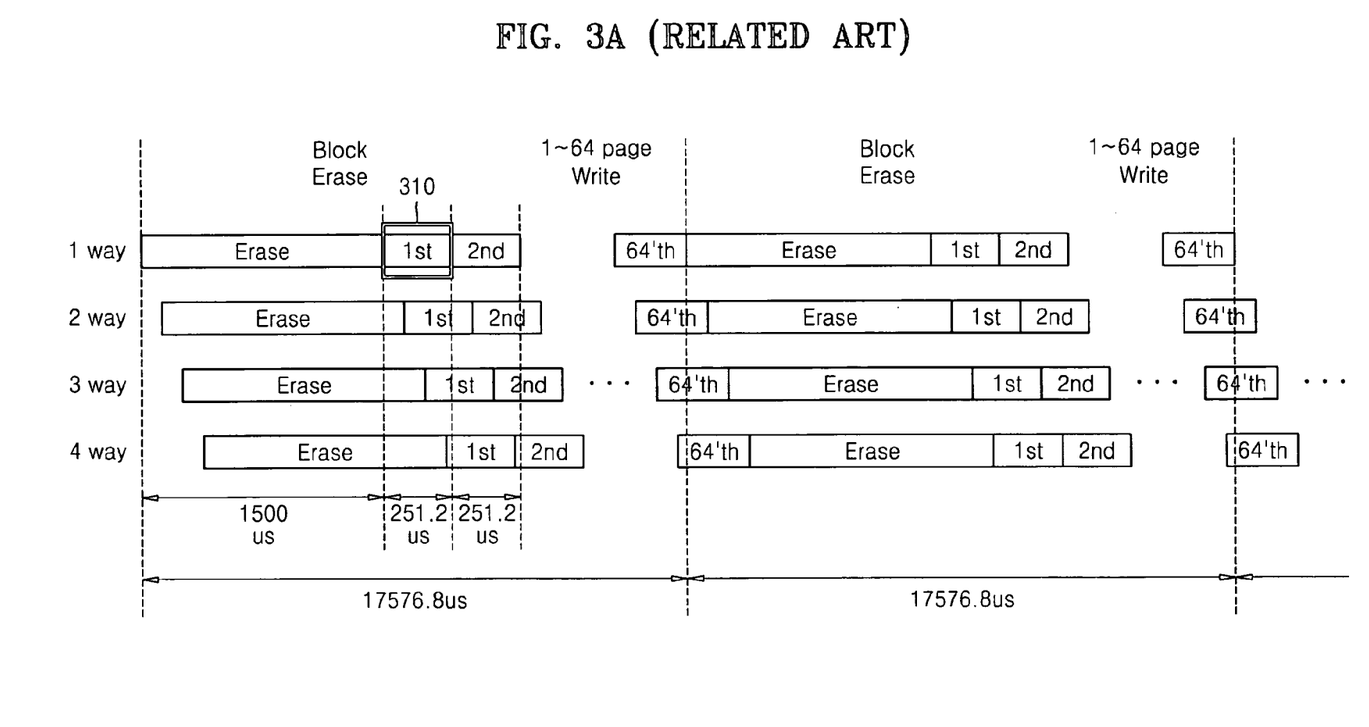
FIG. 3A is a timing diagram for a write operation with respect to four flash memories in a channel of FIG. 2.
Figure 3B:
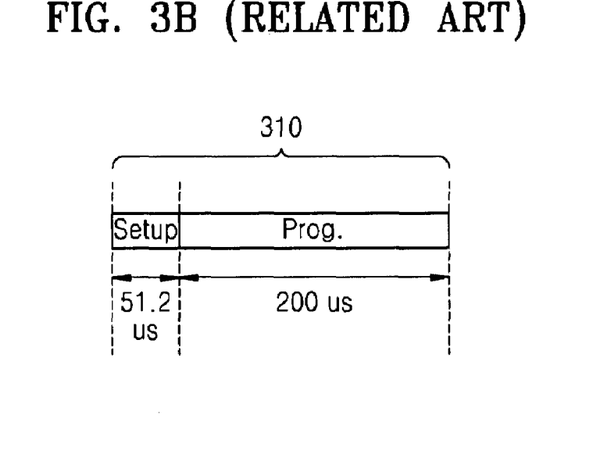
FIG. 3B illustrates in detail a write operation of a page in FIG. 3A.

FIG. 3A is a timing diagram for a write operation with respect to four flash memories in a channel illustrated in FIG. 2, and FIG. 3B illustrates in detail a write operation of a page illustrated in FIG. 3A.

As illustrated in FIG. 3B, in a write operation 310 of a page, when a page unit of 2 KB is applied, setup time is 51.2 µsec (setup time for 1 Byte is 25 nsec) and programming time is 200 µsec. To compensate for slow programming time, large-size data is distributed over four flash memories of each channel for storage, as illustrated in FIG. 2. According to the related art, when programming is performed in a flash memory, setup is performed in another flash memory in an idle state within the same channel so as to minimize the wait time of the controller, thereby implementing a faster write operation.

However, according to the related art, since a non-volatile data storage device like a flash memory uses a single page buffer, it requires a setup time between consecutive program operations. The setup time interrupts the consecutive program operations and reduces the maximum recording speed of a single flash memory. Moreover, when a plurality of flash memories is used as in FIG. 2, if all the flash memories are programmed, the controller 210 cannot perform a setup operation and enters a wait state. In other words, if the operating time of a flash memory according to common performance includes an erasure time of 1500 µsec, a page programming time of 200 µsec, and a one-page setup time of 51.2 µsec (25 nsec for 1 Byte setup), a wait time of 46.4 µsec is generated after four setup operations, in theory, in a 4-way architecture. If the controller 210 could continue performing the setup operation during the wait time, the performance of the entire system would be improved.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a method and apparatus for programming a non-volatile data storage device, in which a fast write operation can be performed using a plurality of page buffers included in the non-volatile data storage device.

According to an aspect of the present invention, there is provided a method for programming a non-volatile data storage device. The method includes programming data in a memory cell array included in the non-volatile data storage device using one selected from among a plurality of page buffers included in the non-volatile data storage device and performing a setup operation for loading data using another page buffer, apart from the page buffer selected during the programming.

The method may further include repeating performance of the setup operation for loading data using another page buffer, apart from the page buffer selected during the programming in the memory cell array.

In the method, the plurality of page buffer may include a first page buffer, a second page buffer, and a page buffer for the setup operation or for programming may be selected from among the first page buffer and the second page buffer according to a page buffer selection signal at a predetermined point of time.

The method may further include (a) transmitting an erase command from a controller that controls the non-volatile data storage device, (b) performing a setup operation for loading data and programming using the first page buffer after execution of the erase command is completed, (c) performing a setup operation for loading next data using the second page buffer during programming using the first page buffer, and (d) performing programming using the second page buffer after programming using the first page buffer is completed.

The method may further include (e) performing a setup operation for loading next data using the first page buffer during programming using the second page buffer, (f) performing programming using the first page buffer if programming using the second page buffer is completed, (g) performing a setup operation for loading next data using the second page buffer during programming using the first page buffer, and (h) performing programming using the second page buffer if programming using the first page buffer is completed.

The method may further include (a) transmitting an erase command from a controller that controls the non-volatile data storage device, (b) performing a setup operation for loading data using the second page buffer during execution of the erase command, (c) performing programming using the second page buffer if execution of the erase command is completed and performing a setup operation using the first page buffer during programming using the second page buffer, and (d) performing programming using the first page buffer if programming using the second page buffer is completed.

The method may further include (e) performing a setup operation for loading data using the second page buffer during programming using the first page buffer, (f) performing programming using the second page buffer if programming using the first page buffer is completed, (g) performing a setup operation using the first page buffer during programming using the second page buffer, and (h) performing programming using the first page buffer if programming using the second page buffer is completed, in which.

According to another aspect of the present invention, there is provided an apparatus for programming a non-volatile data storage device. The apparatus includes a plurality of page buffers being included in the non-volatile data storage device, a control commanding unit which transmits a command for programming data in a memory cell array included in the non-volatile data storage device using one selected from among the plurality of page buffers, and an input/output control unit which controls a setup operation for loading data using another page buffer, apart from the page buffer selected during the programming.

The setup operation for loading data using another page buffer, apart from the page buffer selected during the programming in the memory cell array may be repeated.

The plurality of page buffers may include a first page buffer and a second page buffer, and the apparatus may further include a page buffer selection unit which selects a page buffer for the setup operation or for programming from among the first page buffer and the second page buffer at a predetermined point of time.

According to another aspect of the present invention, there is provided a computer-readable recording medium having recorded thereon a program for implementing the method of programming a non-volatile data storage device.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Hereinafter, exemplary embodiments of the present invention will be described in detail with reference to the accompanying drawings. In the following description, a flash memory will be taken as an example of a non-volatile data storage device. Although the following exemplary embodiments of the present invention are based on a flash memory, they can be applied to all kinds of non-volatile data storage devices.

Figure 4:
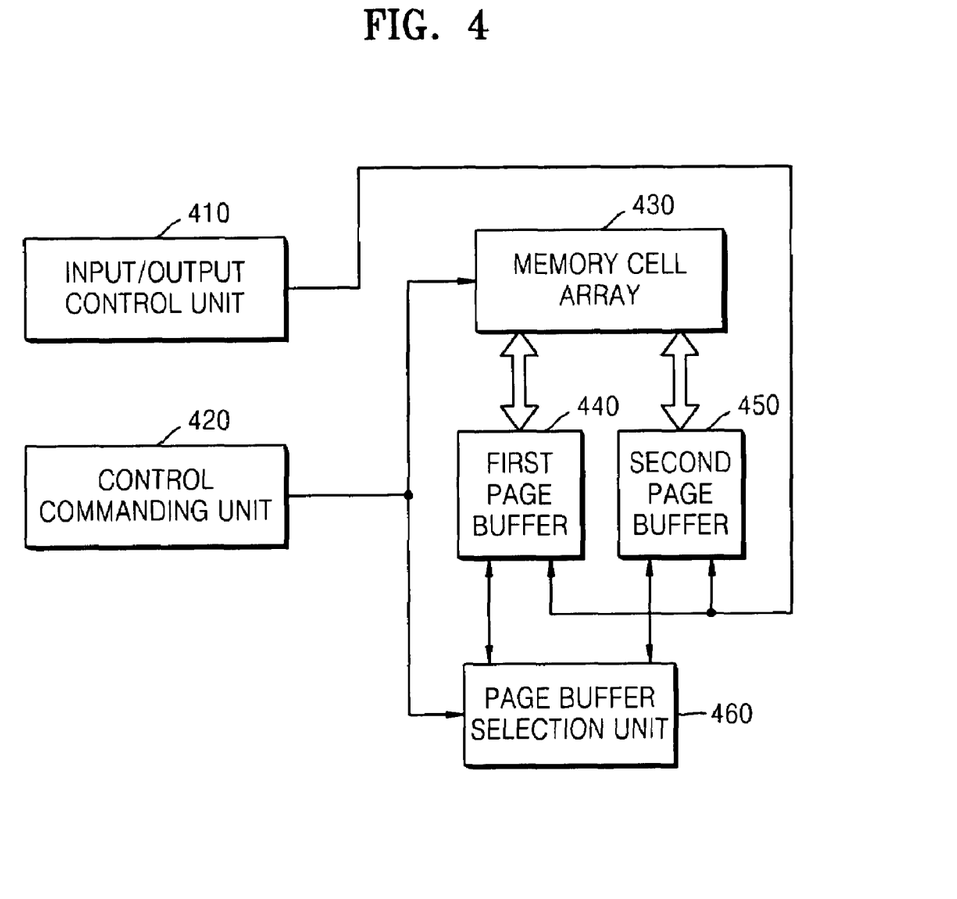
FIG. 4 is a block diagram of an apparatus for programming a flash memory according to an exemplary embodiment of the present invention.

FIG. 4 is a block diagram of an apparatus for programming a flash memory according to an exemplary embodiment of the present invention.

Referring to FIG. 4, the apparatus for programming a flash memory includes an input/output control unit 410, a control commanding unit 420, a memory cell array 430, a first page buffer 440, a second page buffer 450, and a page buffer selection unit 460.

The input/output control unit 410 controls input/output of data to be written/read. Addresses and data of rows and columns of the memory cell array 430 (memory cells of a selected page) are consecutively input to the flash memory. In general, data to be programmed is sequentially transmitted to the first page buffer 440 and the second page buffer 450 in units of a byte or word. The input/output control unit 410 loads data to be programmed to the first page buffer 440 and the second page buffer 450 from an external host.

The control commanding unit 420 transmits a write command to the flash memory. Data stored in the first page buffer 440 and the second page buffer 450 is programmed in the memory cell array 430 according to a programming command. Before data is re-written to an already- recorded region, an erase command is transmitted to each block. In other words, after an erase operation is performed for each block through the erase command, data is sequentially written in a plurality of pages forming each block.

The memory cell array 430 is a storage region for storing information in the flash memory and consists of a plurality of cell strings. Although not shown in figures, as well known, each cell string includes a string selection transistor, a ground selection transistor, and a plurality of flash or non-volatile memory cells connected in series between the selection transistors. The string selection transistor and the ground selection transistor are controlled by a string selection line and a ground selection line. Flash memory cells of each cell string include floating gate transistors whose control gates are connected to word lines. The erasure of a memory cell of the memory cell array 430 occurs due to a Fowler-Nordhein tunneling effect, in which electrons penetrate a thin dielectric material and remove charges from a floating gate connected with each memory cell.

The first page buffer 440 and the second page buffer 450 are registers included in the flash memory to store data in the memory cell array 430 or read data from the memory cell array 430. According to an exemplary embodiment of the present invention, the number of page buffers is increased to plural (dual page buffers). As illustrated in FIG. 4, the memory cell array 430 selects two page buffers for data write/read operations. Although the first page buffer 440 and the second page buffer 450 are taken as examples of the two page buffers in an exemplary embodiment of the present invention, it is obvious to those skilled in the art that three or more page buffers may be used to achieve this aspect of the present invention.

The page buffer selection unit 460 provides a buffer selection signal for selecting one of the plurality of page buffers 440 and 450 when the input/output control unit 410 and the control commanding unit 420 performs input/output operations. Through the buffer selection signal, a page buffer for performing data input/output between the input/output control unit 410 and the page buffers 440 and 450 and data write/read operation between the page buffers 440 and 450 and the memory cell array 430 can be selected.

Figure 5:
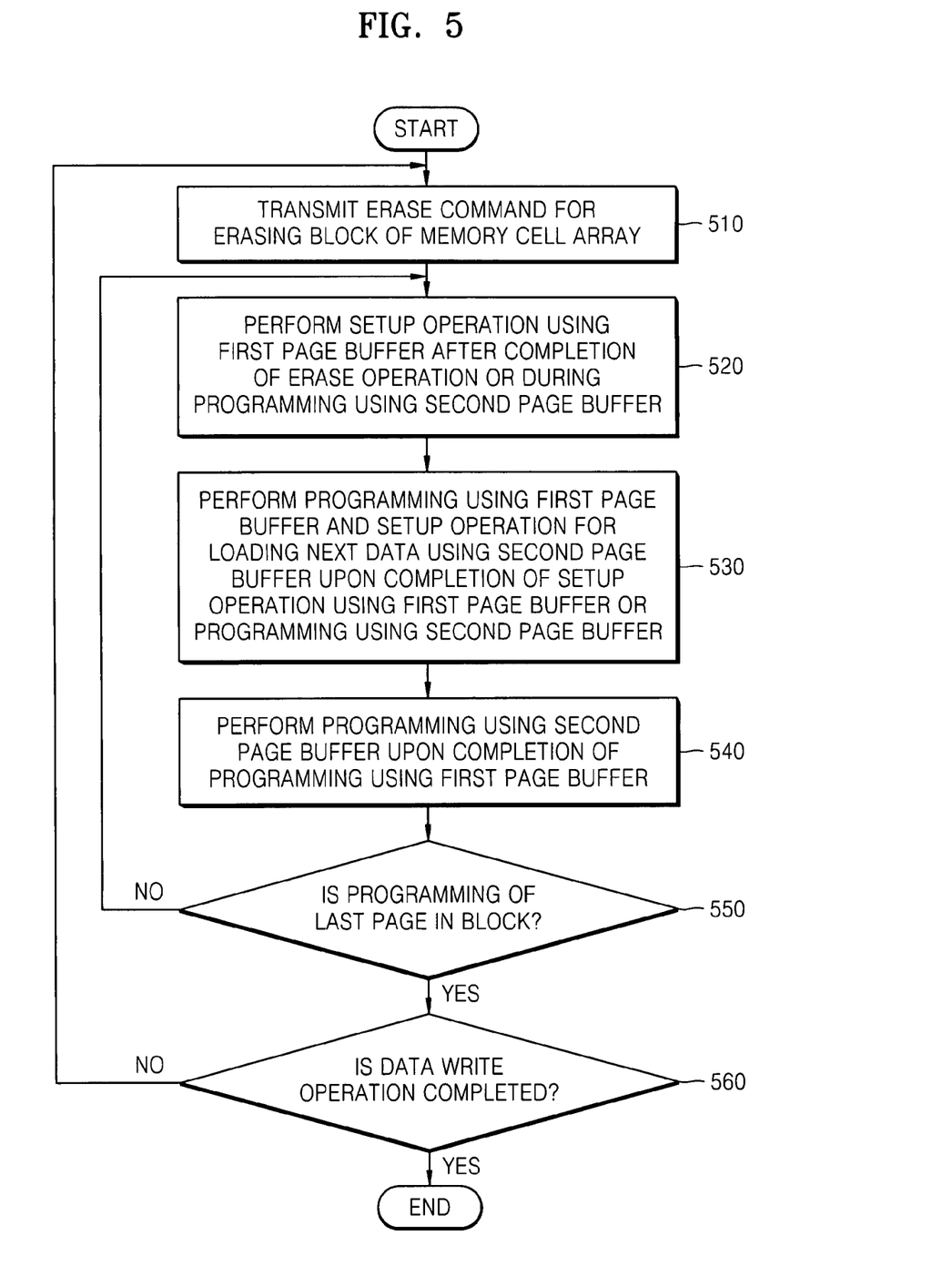
FIG. 5 is a flowchart illustrating a method of programming a flash memory according to another exemplary embodiment of the present invention.

FIG. 5 is a flowchart illustrating a method of programming a flash memory according to another exemplary embodiment of the present invention.

Referring to FIG. 5, an erase command of a block of the memory cell array 430 is transmitted from the control commanding unit 420 in operation 510. Operation 510 is an essential operation to be performed in units of a block prior to setup and programming in the flash memory.

In operation 520, after a block erase operation is completed, a setup operation for loading data is performed using the first page buffer 440.

In operation 530, after completion of the setup operation using the first page buffer 440, a program operation is performed in the first page buffer 440. Since the input/output control unit 410 is in a wait state during programming using the first page buffer 440, a setup operation for loading next data is performed using the second page buffer 450 to remove the wait state.

In operation 540, after programming using the first page buffer 440 is completed, a program operation is performed immediately in the second page buffer 450 because the setup operation in the second page buffer 450 has already been completed.

In operation 550, if there are pages being not programmed in the block, operation 520 is performed to program the remaining pages in the block and a setup operation is performed using the first page buffer 440 if a program operation is being performed using the second page buffer 450.

Subsequently, if programming using the second page buffer 450 is completed in operation 530, a program operation is performed using the first page buffer 440 and next data is set up using the second page buffer 450.

In this manner, since program operations between the first page buffer 440 and the second page buffer 450 are repeated until programming of the last page in a block is completed, programming is performed continuously and the maximum recording speed of a single flash memory is improved.

Operations 510 through 550 are repeated until data to be written is all programmed in operation 560.

Figure 6:
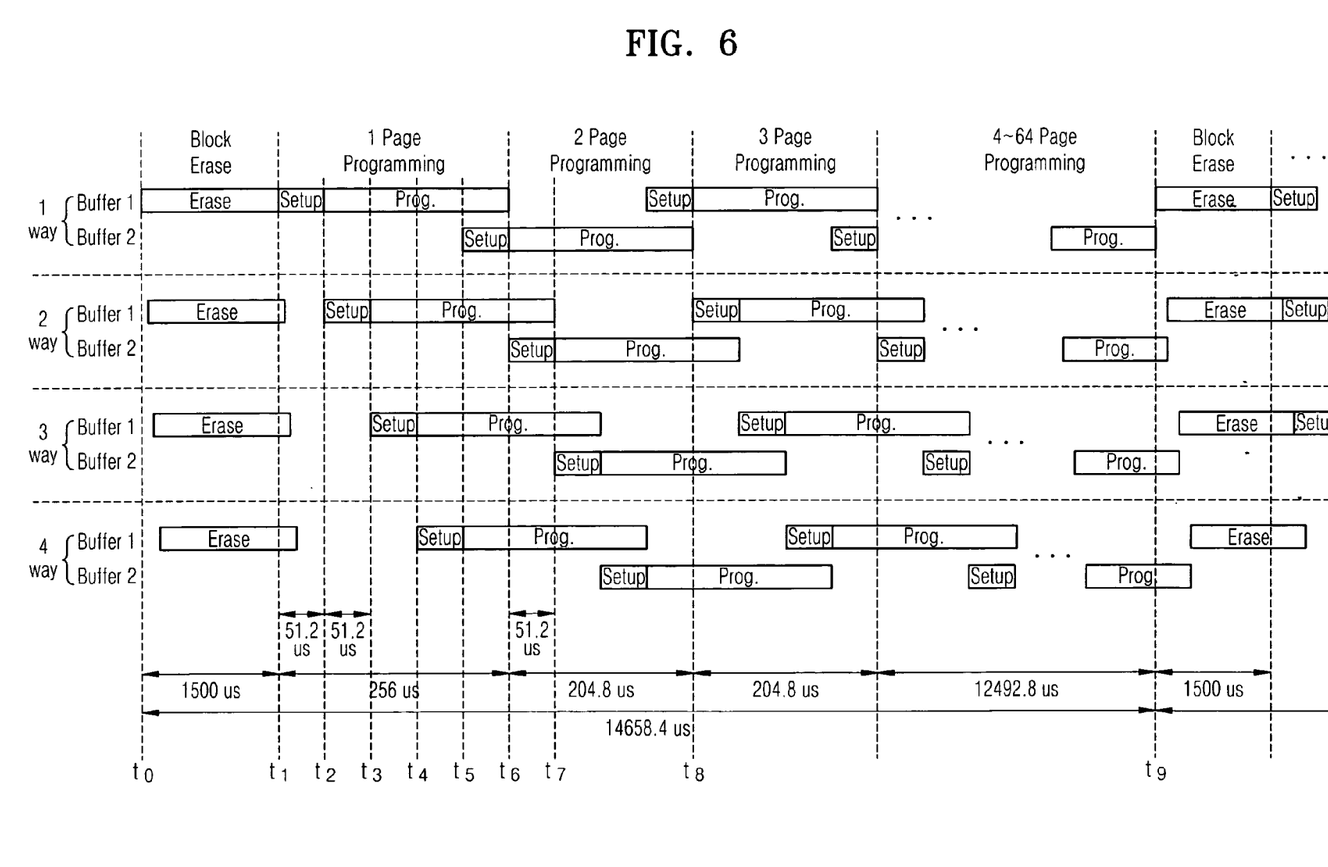
FIG. 6 is a timing diagram for a write operation with respect to a flash memory according to the method of programming the flash memory illustrated in FIG. 5.

FIG. 6 is a timing diagram for a write operation with respect to a flash memory according to the method of programming the flash memory illustrated in FIG. 5. It is assumed that the erasure time is 1500 μsec, the one-page (2 kB) setup time is 51.2 μsec, the one-page programming time is 200 μsec, and one block is composed of 64 pages according to the performance of a general flash memory.

Referring to FIG. 6, four flash memories from one-way to four-way (first through fourth flash memories) are connected to one channel. FIG. 6 shows an example of the condition of only one channel in an N-channel/four-way structure. Here, the priorities of a first page buffer and a second page buffer are equal.

An erase operation and a write operation for one block are completed from t0 to t9. After t9, a procedure performed from t0 to t9 is repeated.

At t0, a flash memory controller transmits an erase command to the four flash memories and each of the flash memories erases a block for 1500 μsec.

A setup operation is performed using the first page buffer of the first flash memory (51.2 μsec) at t1 and a program operation is performed using the first page buffer (200 μsec) at t2 after completion of the setup operation. At the same time, at t2, a setup operation is performed using the first page buffer of the second flash memory. After setup operations are sequentially performed in the third flash memory and the fourth flash memory at t3 and t4 in the same manner as in the first flash memory and the second flash memory, a setup operation is performed using the second page buffer of the first flash memory at t5. The time from t1 to t6 is 256 μsec for writing a first page and after t6, a program operation for writing the next page can be performed immediately using the second page buffer of the first flash memory. The time from t1 to t6 (256 μsec) is a little longer than 251.2 μsec that is the time required for the one-page write operation 310 of FIG. 3A, but it is applied only to a first page.

For a second page (t6) through a sixty-fourth page (t9), the time required for a write operation of each page is reduced to 204.8 μsec, whereby overall performance would be improved.

Overall performance efficiency for 1000 pages according to the related art and the present invention can be compared as follows:

(i) Related Art (2K * 1000) (Bytes)/(17576.8 * 1000/64/4+153.6)
(μsec)=29.76 Mbytes/sec (ii) FIG. 6

(2K * 1000) (Bytes)/(14658.4 * 1000/64/4+153.6)
(μsec)=35.67 Mbytes/sec

As such, a performance improvement of about 19.86% can be achieved according to the present invention.

Figure 7:
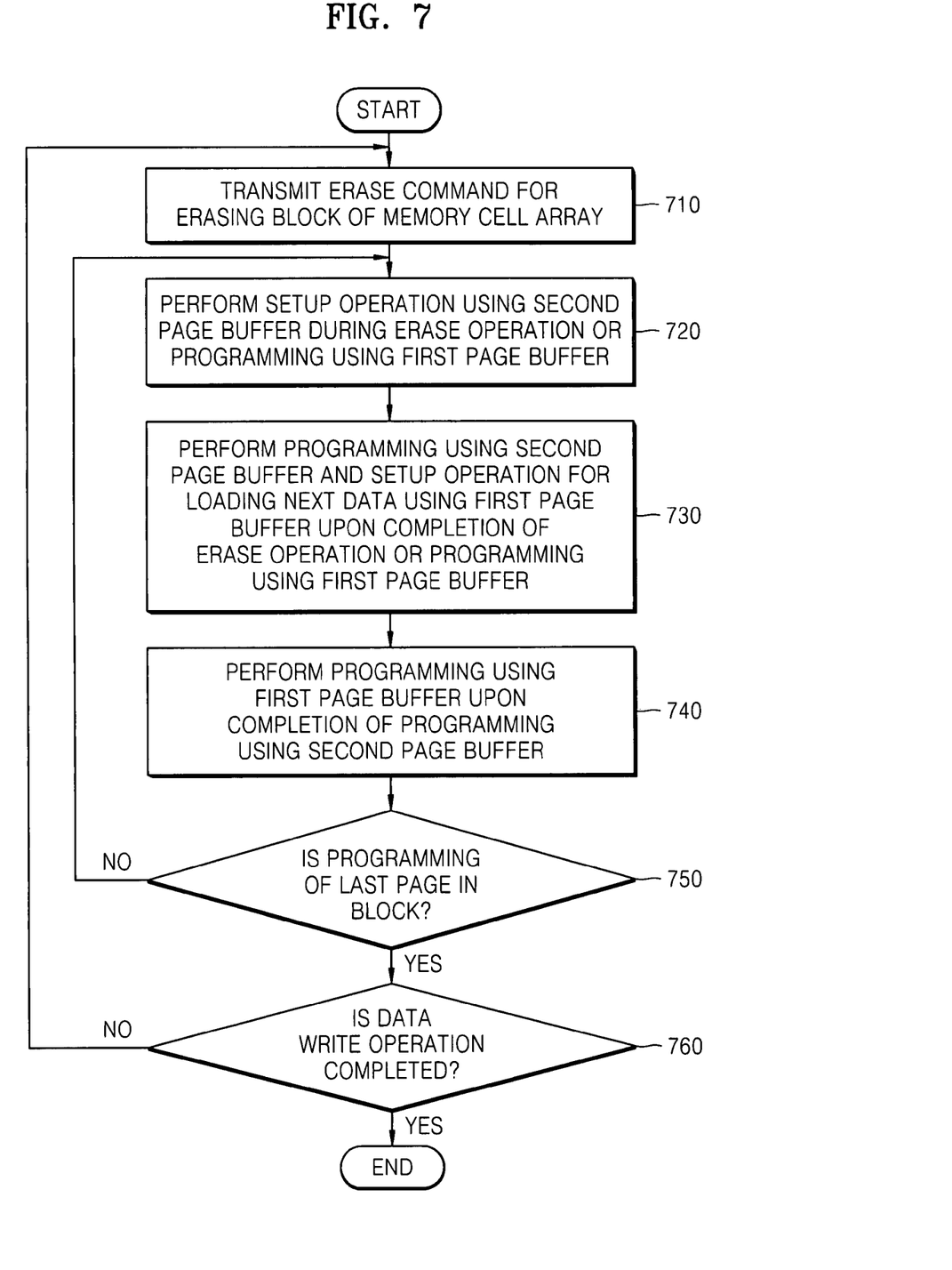
FIG. 7 is a flowchart illustrating a method of programming a flash memory according to another exemplary embodiment of the present invention.

FIG. 7 is a flowchart illustrating a method of programming a flash memory according to another exemplary embodiment of the present invention.

Referring to FIG. 7, the control commanding unit 420 transmits an erase command for erasing a block of the memory cell array 430 in operation 710.

In operation 720, during a block erase operation, a setup operation for loading data is performed using the second page buffer 450. Since the input/output control unit 410 is in a wait state during the block erase operation, the setup operation is performed using the second page buffer 450 to remove the wait state.

In operation 730, since the setup operation in the second page buffer 450 is completed after completion of the block erase operation, a program operation can be immediately performed using the second page buffer 450. In addition, since the first page buffer 440 is in an idle state during programming using the second page buffer 450, a setup operation for loading next data can be performed using the first page buffer 440.

In operation 740, since the setup operation in the first page buffer 440 has already been completed after completion of programming using the second page buffer 450, a program operation can be immediately performed using the first page buffer 440.

In operation 750, if there are pages being not programmed in the block, operation 720 is performed again for programming of the remaining pages of the block and a setup operation is performed using the second page buffer 450 during programming using the first page buffer 440.

Subsequently, in operation 730, after completion of programming using the first page buffer 440, a program operation is performed using the second page buffer 450 and a setup operation for loading next data is performed using the first page buffer 440.

As such, since program operations between the first page buffer 440 and the second page buffer 450 are repeated until completion of the last page of a block (operation 750), programming is performed continuously and the maximum recording speed of a single flash memory can be improved. In particular, a block erase operation and a setup operation for the first page are performed at the same time, whereby the entire operating time would be reduced much more.

Operations 710 through 750 are repeated until programming of data to be recorded is completed in operation 760.

Figure 8:
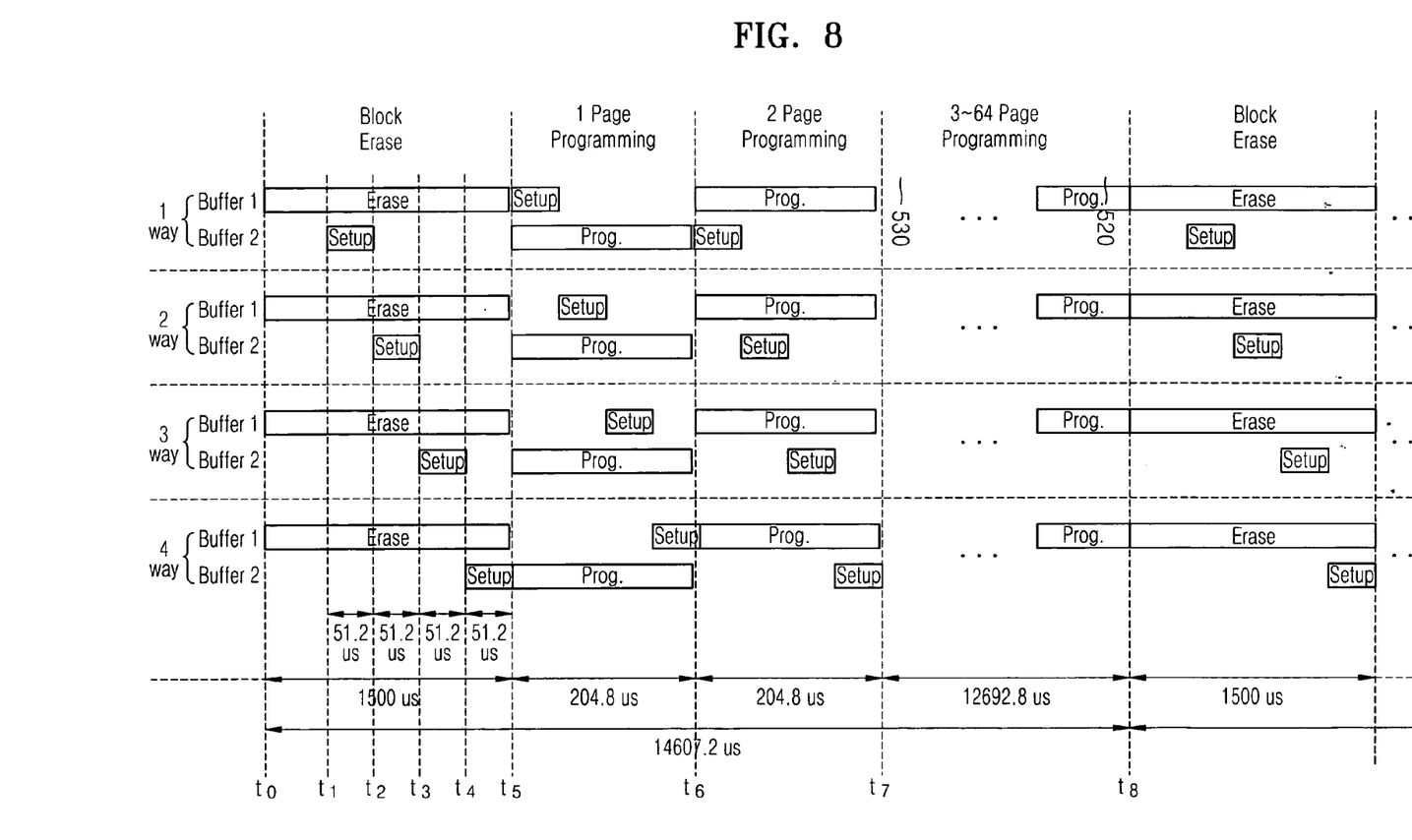
FIG. 8 is a timing diagram for a write operation with respect to a flash memory according to the method of programming the flash memory illustrated in FIG. 7.

FIG. 8 is a timing diagram for a write operation with respect to a flash memory according to the method of programming the flash memory illustrated in FIG. 7. As mentioned above, it is assumed that the erasure time is 1500 μsec, the one-page (2 kB) setup time is 51.2 μsec, the one-page programming time is 200 μsec, and one block is composed of 64 pages according to the performance of a general flash memory.

Referring to FIG. 8, four flash memories from one-way to four-way (first through fourth flash memories) are connected to one channel. FIG. 6 shows an example of the condition of only one channel in an N-channel/four-way structure. Here, the priorities of a first page buffer and a second page buffer are equal. An erase operation and a write operation for one block are completed from t0 to t8. After t8, a procedure performed from t0 to t8 is repeated.

At t0, a flash memory controller transmits an erase command to the four flash memories and each of the flash memories erases a block for 1500 μsec.

A setup operation is performed using the second page buffer of the first flash memory (51.2 μsec) at t1 and a setup operation is performed using the second page buffer of the second flash memory at t2 after completion of the setup operation in the first flash memory. Setup operations are sequentially performed using the second page buffers of the third flash memory and the fourth flash memory at t3 and t4 in the same manner as in the first flash memory and the second flash memory. Since the block erase operation requires long time (1500 μsec), setup for the first page in all the four flash memories in the same channel is previously performed.

After completion of the block erase operation, programming is performed using the second page buffers of all the flash memories in the same channel at t5. In the meantime, a setup operation for next data is sequentially performed using the first page buffers of each of the flash memories.

In this way, time from t5 to t6 is 204.8 μsec and programming can be performed immediately in the first page buffers of the flash memories in which setups have already been completed. The time from t5 to t6 (204.8 μsec) is reduced when compared to time required for the one-page write operation 310 of FIG. 3A, i.e., 251.2 μsec for the first page, and 256 μsec in FIG. 6. The processing time for each page from a second page (t6) through a sixty-fourth page (t8) is also uniform as 204.8 μsec.

Overall performance efficiency for 1000 pages according to the related art and the present invention can be compared as follows:

(i) Related Art (2K * 1000) (Bytes)/(17576.8 * 1000/64/4+153.6)
(μsec)=29.76 Mbytes/sec (ii) FIG. 8

(2K * 1000) (Bytes)/(14602.4 * 1000/64/4)
(μsec)=35.90 Mbytes/sec

As such, a performance improvement of about 20.64% can be achieved according to the present invention.

Meanwhile, the method of programming a non-volatile data storage device according to the present invention can also be embodied as computer-readable code on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion.

As described above, according to the present invention, a non-volatile data storage device can perform an erasure or program operation using a plurality of page buffers included in the non-volatile data storage device. Moreover, according to the present invention, the time generated due to setup of page data can be minimized and the fast write performance of a large-size storage device can be improved. As a result of performance analysis, an apparatus for programming a non-volatile data storage device according to the present invention has a performance improvement of about 20% when compared to that according to the related art.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming a non-volatile data storage device in a multi-channel system using a plurality of non-volatile data storage devices, the method comprising:
    programming data in a memory cell array included in the non-volatile data storage device using a first page buffer selected from among a plurality of page buffers included in each of the non-volatile data storage devices;
    performing, during the programming, a setup operation for loading data using a second page buffer, which is different from the first page buffer used during the programming; and
    programming data in the memory cell array using the second page buffer, after the programming using the first page buffer is completed.

2. The method of claim 1, further comprising the repeating performing of the setup operation.

3. The method of claim 2, wherein one of the first page buffer and the second page buffer is selected according to a page buffer selection signal at a point of time to be used for the performing the setup operation or for the programming.

4. The method of claim 3, further comprising:
    (a) transmitting an erase command from a controller that controls the non-volatile data storage device;
    (b) performing a setup operation for loading data and programming using the first page buffer after execution of the erase command is completed; and
    (c) performing a setup operation for loading next data using the second page buffer during the programming using the first page buffer in operation (b).

5. The method of claim 4, further comprising:
    (e) performing a setup operation for loading next data using the first page buffer during the programming using the second page buffer in operation (d);
    (f) performing programming using the first page buffer if the programming using the second page buffer in operation (d) is completed;
    (g) performing a setup operation for loading next data using the second page buffer during the programming using the first page buffer in operation (f); and
    (h) performing programming using the second page buffer if programming using the first page buffer in operation (f) is completed.

6. The method of claim 3, further comprising:
    (a) transmitting an erase command from a controller that controls the non-volatile data storage device;
    (b) performing a setup operation for loading data using the second page buffer during execution of the erase command;
    (c) performing programming using the second page buffer if execution of the erase command is completed and performing a setup operation using the first page buffer during programming using the second page buffer; and
    (d) performing programming using the first page buffer if the programming using the second page buffer in operation (c) is completed.

7. The method of claim 6, further comprising:
    (e) performing a setup operation for loading data using the second page buffer during the programming using the first page buffer in operation (d);
    (f) performing programming using the second page buffer if the programming using the first page buffer in operation (d) is completed;
    (g) performing a setup operation using the first page buffer during the programming using the second page buffer in operation (f); and
    (h) performing programming using the first page buffer if the programming using the second page buffer in operation (f) is completed.

8. An apparatus for programming a non-volatile data storage device in a multi-channel system using a plurality of non-volatile data storage devices, the apparatus comprising:
    a plurality of page buffers included in each of the non-volatile data storage devices;
    a control commanding unit which transmits a command for programming data in a memory cell array included in the non-volatile data storage device using a first page buffer selected from among the plurality of page buffers;
    an input/output control unit which, during the programming, controls a setup operation for loading data using a second page buffer, which is different from the first page buffer used during the programming; and
    wherein the control commanding unit transmits a command for programming data in the memory cell array using the second page buffer, after the programming using the first page buffer is completed.

9. The apparatus of claim 8, wherein the input/output control unit repeatedly performs the setup operation for loading data.

10. The apparatus of claim 9, wherein the apparatus further comprises a page buffer selection unit which selects the page buffer used for the setup operation or the other page buffer used for programming from among the first page buffer and the second page buffer at a point of time.

11. A computer-readable recording medium having recorded thereon a program for implementing a method of programming a non-volatile data storage device in a multi-channel system using a plurality of non-volatile data storage devices, the method comprising:
    programming data in a memory cell array included in the non-volatile data storage device using a first page buffer selected from among a plurality of page buffers included in each of the non-volatile data storage devices;
    performing, during the programming, a setup operation for loading data using a second page buffer, which is different from the first page buffer used during the programming; and
    programming data in the memory cell array using the second page buffers after the programming using the first page buffer is completed.

12. The computer readable medium according to claim 11, wherein the method further comprises repeating the performing of the setup operation.

13. The computer readable medium according to claim 12, wherein one of the first page buffer and the second page buffer is selected according to a page buffer selection signal at a point of time to be used for the performing the setup operation or for the programming.

14. The computer readable medium according to claim 13, wherein the method further comprises:
    (a) transmitting an erase command from a controller that controls the non-volatile data storage device;

(b) performing a setup operation for loading data and programming using the first page buffer after execution of the erase command is completed; and (c) performing a setup operation for loading next data using the second page buffer during the programming using the first page buffer in operation (a).

15. The computer readable medium according to claim 14, wherein the method further comprises:

(e) performing a setup operation for loading next data using the first page buffer during the programming using the second page buffer in operation (d);

(f) performing programming using the first page buffer if the programming using the second page buffer in operation (d) is completed;

(g) performing a setup operation for loading next data using the second page buffer during the programming using the first page buffer in operation (f); and (h) performing programming using the second page buffer if programming using the first page buffer in operation (f) is completed.

16. The computer readable medium according to claim 13, wherein the method further comprises:

(a) transmitting an erase command from a controller that controls the non-volatile data storage device;

(b) performing a setup operation for loading data using the second page buffer during execution of the erase command;

(c) performing programming using the second page buffer if execution of the erase command is completed and performing a setup operation using the first page buffer during programming using the second page buffer; and (d) performing programming using the first page buffer if the programming using the second page buffer in operation (c) is completed.

17. The computer readable medium according to claim 16, wherein the method further comprises:

performing a setup operation for loading data using the second page buffer during the programming using the first page buffer;

performing programming using the second page buffer if the programming using the first page buffer is completed;

performing a setup operation using the first page buffer during the programming using the second page buffer in the performing programming using the second page buffer if the programming using the first page buffer; and performing programming using the first page buffer if the programming using the second page buffer in the performing programming using the second page buffer if the programming using the first page buffer is completed.

* * * * *